United States Patent [19]

Seliger et al.

[11] 4,149,055

[45] Apr. 10, 1979

[54] FOCUSING ION ACCELERATOR

[75] Inventors: Robert L. Seliger, Agoura; James W. Ward, Canoga Park, both of Calif.

[73] Assignee: Hughes Aircraft Company, Culver City, Calif.

[21] Appl. No.: 792,965

[22] Filed: May 2, 1977

[51] Int. Cl.² ............................................. H01J 37/04
[52] U.S. Cl. .......................... 250/396 R; 250/423 R; 315/111.3
[58] Field of Search ............... 250/396 R, 423 R, 426, 250/427; 315/111.2, 111.3; 313/360, 361, 362

[56] References Cited
U.S. PATENT DOCUMENTS 2,665,384  1/1954  Yockey ................................. 250/396
3,678,267  7/1972  Werner ................................. 250/427
3,955,091  5/1976  Robinson et al. ..................... 250/423

*Primary Examiner*—Alfred E. Smith
*Assistant Examiner*—B. C. Anderson
*Attorney, Agent, or Firm*—Allen A. Dicke; W. H. MacAllister

[57] ABSTRACT

A high current ion beam is extracted from an ion plasma by a low perveance ion optical system including a screen electrode, a final electrode and an intermediate electrode therebetween which is shaped to correspond to the extraction voltage equipotentials therebetween. By controlling the voltage of the intermediate electrode with respect to the other two electrodes focusing is accomplished.

8 Claims, 4 Drawing Figures

FOCUSING ION ACCELERATOR

BACKGROUND OF THE INVENTION

This invention is directed to a focusing low perveance ion accelerator having three electrodes in the low perveance ion optical system and arranged so that voltage variation causes ion beam focusing.

The generation of high current well formed and focused ion beams is essential in ion implantation, ion microscopy and most recently in ion beam fusion where high brightness is desirable.

U.S. Pat. No. 3,955,091 defines a low perveance system wherein two electrodes, a focus electrode and an extraction electrode, each specially shaped, produce a high energy ion beam having greater intensity and less divergence and distortion than those produced by prior methods and apparatus. Such a configuration produces an ion beam current which is proportional to $V_o^{3/2}$, where $V_o$ is the voltage of the extraction electrode with respect to the focus electrode. Beam focus is controlled only by adjusting the plasma density in the ion source. There is thus need for additional control over beam focus and current.

SUMMARY

In order to aid in the understanding of this invention it can be stated in essentially summary form that it is directed to a low perveance focusing ion accelerator which has an intermediate electrode between its screen electrode and final electrode. The intermediate electrode is shaped to correspond to one of the equipotential lines that would be found in between the screen electrode and final electrode with no other electrodes present. Voltage control of the intermediate electrode controls beam current and ion beam focus.

It is thus an object of this invention to provide a focusing ion accelerator which has an intermediate electrode which is capable of aiding in the control of focus of an ion beam. It is another object to provide an ion beam focusing arrangement where the ion beam spread is controlled by intermediate electrode voltage. It is another object to provide a focusing ion accelerator wherein beam current is not proportional to $V_o^{3/2}$. It is another object to provide an ion accelerator wherein beam focus can be controlled by other methods than by adjusting the plasma density in the ion source. Other objects and advantages of this invention will become apparent from the study of the following portion of this specification, the claims and the attached drawings.

DESCRIPTION OF THE PREFERRED EMBODIMENT

Figure 1:
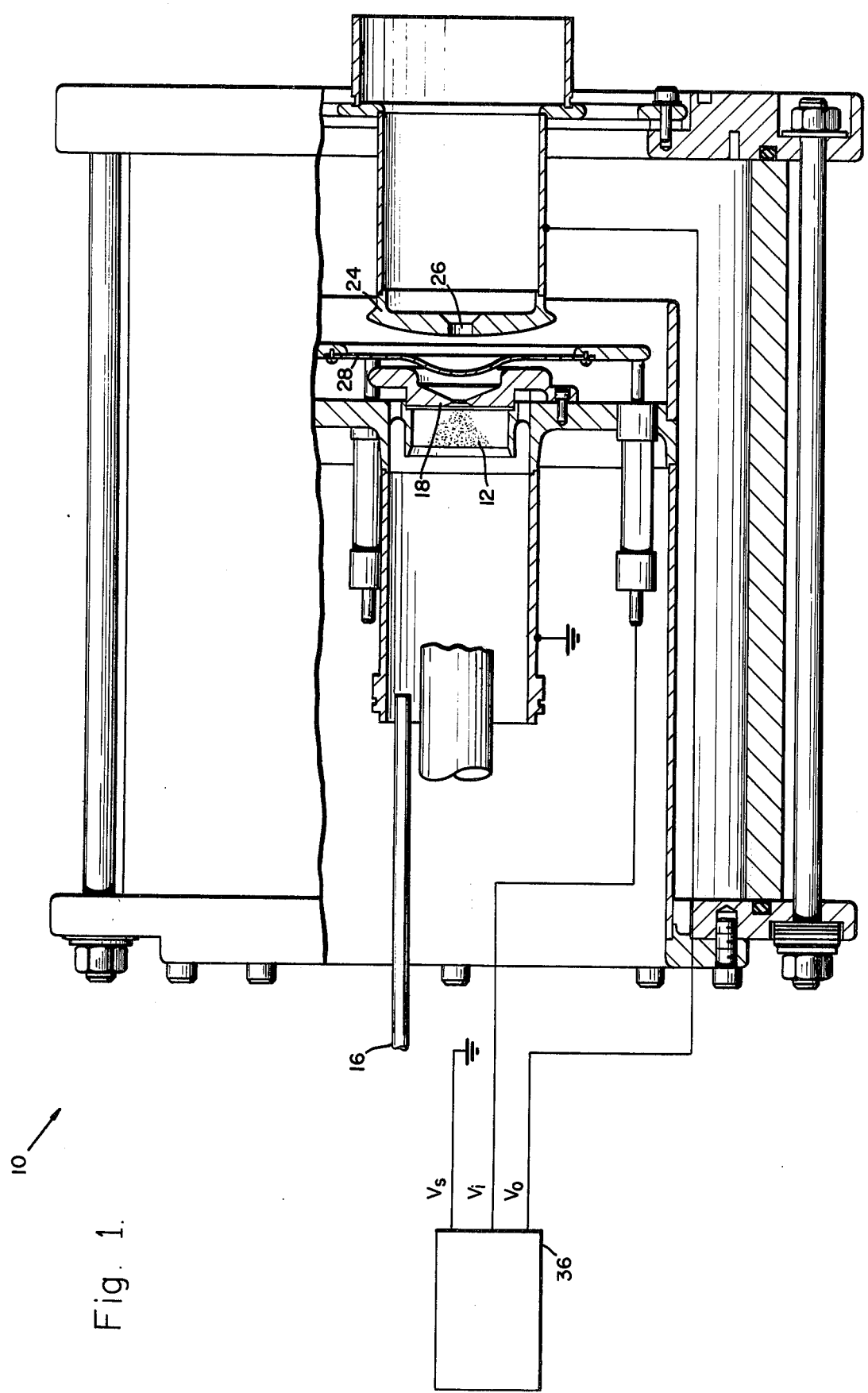
FIG. 1 is a longtitudinal section through the focusing ion accelerator of this invention.

The focusing ion accelerator is generally indicated at 10 in FIG. 1. FIG. 1 is principally a longitudinal section through the center line of the ion accelerator. Ions are produced in any convenient way. A gas or vapor to be ionized is supplied by pipe 16. The gas molecules move into the active region and are ionized to provide a plasma 12 containing the desired ion species, see FIGS. 1 and 3. This production of ions by a Penning discharge is shown in H. R. Kaufman U.S. Pat. No. 3,156,090.

Other methods of production of the electrons or ions are possible. For example, R. C. Knechtli U.S. Pat. No. 3,831,052 teaches the production of electrons or ions by use of a thin wire anode hollow cathode discharge.

At the downstream end of the plasma chamber screen electrode 18 has ion beam opening 20. The ions drift across the plasma sheath 14 into the opening and are accelerated to form beam 22, see FIGS. 2, 3 and 4. Downstream of screen electrode is final electrode 24. Final electrode 24 has beam opening 26 therein.

Electron and ion guns have been classified according to a parameter called perveance, P, which has been defined as the ratio of the current I in a beam to the three-halves power of the anode or extractor voltage $V_o$. This parameter is a measure of beam flux or field density, and is familiar from its use in connection with space-charge-limited diodes and similar devices where it is a function of only the geometric structure.

For an ion beam the extracted current is also proportional to $M^{-1/2}$, where M is the ion mass. It is therefore convenient to describe a particular geometric electrode structure in terms of its electron perveance $P_e$, in which case M is the mass of an electron.

Space charge analysis of low perveance, high voltage ion extraction systems, as employed in this invention, where $P_e$ is less than $1 \times 10^{-7}$ amps-volts$^{-3/2}$, has shown that these systems produce highly laminar, narrow angle ion beams. Such high quality beams may be easily transported over the long distances encountered in ion implanters, ion microprobes and ion beam fusion columns.

On the other hand, it is well known that ion beams that are produced by high perveance extraction systems, where $P_e$ is greater than $1 \times 10^{-7}$ amps-volts$^{-3/2}$, generally suffer from aberrations that are caused by distortion of the equipotential lines near the emitting surface. These aberrations cause permanent disorder such as crossing over among the ion beam trajectories that cannot ever be removed. Hence the post acceleration of ion beams that are extracted at high perveance are of poor quality and cannot be well collimated or focused as is necessary in many applications.

An attempt to control the focus of a low perveance ion beam by varying the ion source plasma density also lowers the quality of the extracted beam. When the extraction voltage is applied, the source plasma forms a sheath covering the focus electrode aperture. The shape of the exposed surface of the sheath varies with changes in operating conditions, such as the ion density of the plasma, the extraction voltage, and the shape of the electric field lines in close proximity to the ion source aperture. The ion trajectories and their initial direction are largely determined by the shape of the sheath because the beam is emitted substantially normal to the sheath surface. When the plasma density is adjusted so that the ion arrival rate at the plasma sheath equals the rate of ion extract corresponding to the low design perveance (i.e. $P_e < 1 \times 10^{-7}$), ion beam of nominally high quality are produced. However, if from a high quality beam condition the extraction potential is then raised without increasing the plasma density, the increased electric field gradients cause the plasma sheath to become more concave because ions are extracted faster than the plasma produces them. The resulting ion trajectories being normal to the sheath surface, tend to converge but result in distorted ion trajectories and a poor quality ion beam. Similarly, a decrease in extraction voltage does not remove ions from the sheath as fast as they are produced so that either a poorly formed divergent beam is produced or the sheath breaks, discharging plasma into the electrode area to short out the electrodes. Consequently, the focusing of the acceptably well-formed ion beams which have been producible by conventional methods and apparatus, such as the low perveance single gap accelerator U.S. Pat. No. 3,955,091, has been limited.

In accordance with the present invention, the facing surfaces 30 and 32 of the screen and final electrodes 18 and 24 are specially shaped to control the equipotential lines 26. This electrode arrangement provides equipotential lines that are required near the plasma sheath to produce a high quality ion beam 22. By extracting an initially well-formed beam having small divergence and low aberration from beam opening 20, better beam focus can be achieved.

Figure 2:
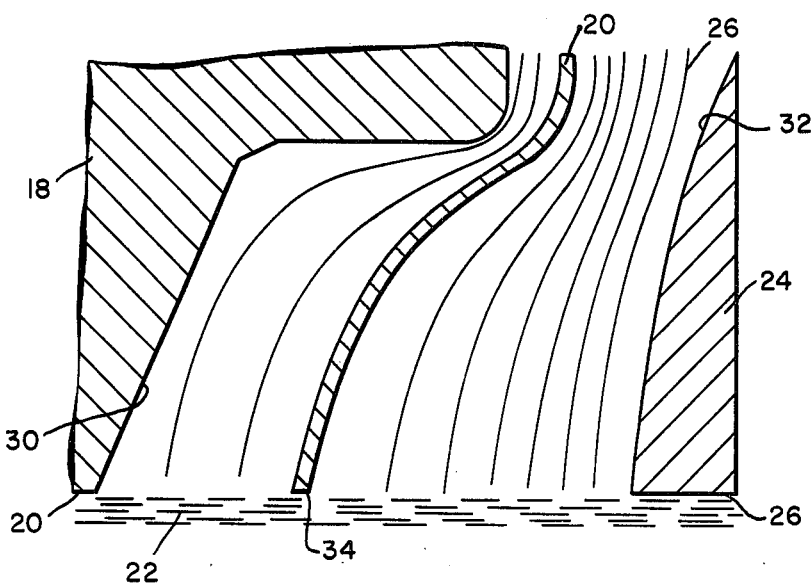
FIGS. 2, 3 and 4 are enlarged partial longitudinal sections, broken away at the beam center line, which show the position of the equipotential lines and the beam focus with different voltages applied to the intermediate electrode.

Intermediate electrode 28 is provided between the screen and final electrodes 18 and 24. Intermediate electrode 28 is shaped to correspond to the shape of one of the equipotential lines 26 when they are normally distributed between the screen and the final electrodes. Thus, it is dished and its concave side is facing the direction of the beam. It has beam opening 34 therein. In FIG. 2, the extraction equipotential lines are illustrated for the case where there is no focusing voltage applied to the intermediate electrode. In other words, the equipotential lines 26 in FIG. 2 are shaped as if intermediate electrode 28 is not in position.

Figure 3:
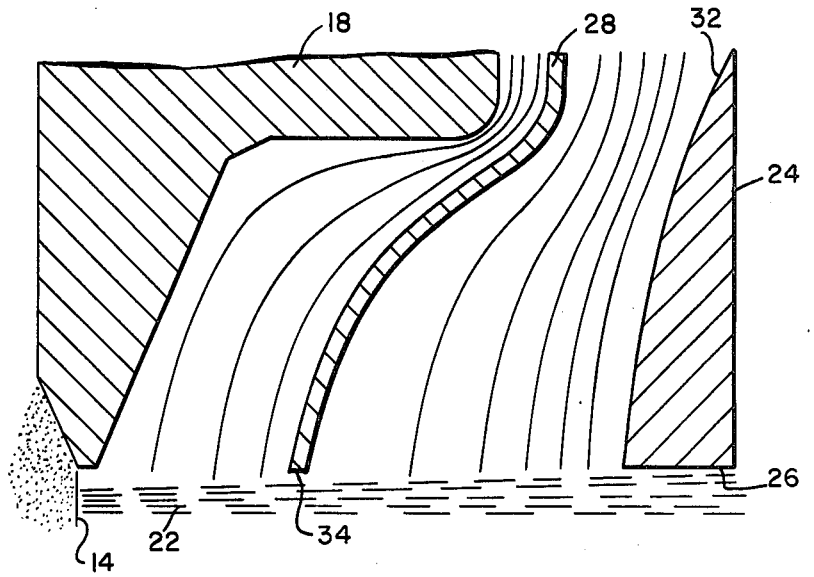

The position of intermediate electrode 28 can be selected at any position along any equipotential line between screen electrode 18 and final electrode 24. In the preferred embodiment and as an illustrative choice, intermediate electrode 28 was chosen to be positioned along the 15% potential line. As shown in FIG. 1, power supply 36 is connected to supply voltage $V_s$, which is at ground, to screen electrode 18, and supply voltage $V_i$ to intermediate electrode 28 and voltage $V_o$ to final electrode 24. When $V_i$ is 15% of $V_o$ then the equipotential lines 26 are undistorted by the presence of the intermediate electrode 28. However, by suitable adjustment of power supply 36, $V_i$ can be adjusted to be greater or less than 15% of $V_o$. Moreover, the plasma density can also be varied so as to maintain the balance between the numbers arriving and leaving ions which is the condition at the plasma sheath for producing a well-formed beam. FIG. 3 illustrates a situation in which $V_i$ is 20% of $V_o$ which results in the divergency of beam 26.

Figure 4:
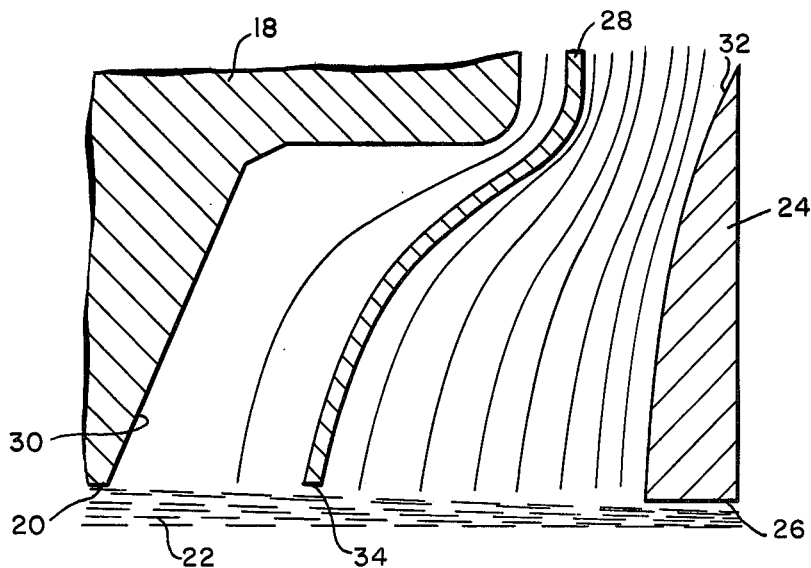

FIG. 4 shows a voltage distribution where $V_i$ equals 10% of $V_o$ to result in a convergent beam. With the presence of intermediate electrode 28, then the voltage which plasma sheath 40 sees, and the voltage which extracts the ions is the $V_i$ voltage. Thus, in this focused ion accelerator the ion beam current is proportional to $V_i^{3/2}$. The beam current can be varied as a function of $V_i$, provided that the plasma density is adjusted accordingly. Thus, $V_i$ is the extraction voltage and draws the beam to opening 34 in the intermediate electrode.

In addition to serving as the extraction electrode, the intermediate electrode 28 should also be viewed as dividing the space between screen 18 and final electrode 24 into two regions, with the region to the left of intermediate electrode 28 being the extraction region and the region to the right being the acceleration region. Accelerating potential is applied, and it is in the acceleration region that control of focus occurs. In the case of FIG. 3, with the increase in extraction voltage by the increase of $V_i$, and the fact that $V_i$ controls the perveance, because $V_i$ controls the field on the sheath, the plasma density can be increased and more beam current is produced without varying $V_o$. However, in the second region, the accelerating region between intermediate electrode 28 and final electrode 24, accelerating potential (which is decreased by the increase in $V_i$) cannot balance the space charge in the beam (which is increased by the increase in $V_o$) so that the beam expands due to its internal space charge against the accelerating potential to produce the divergent beam of FIG. 3. In the convergent case illustrated in FIG. 4, $V_i = 10\%$ of $V_o$ and the plasma density is reduced to produce a lower beam current, and the lower beam current has less expanding space charge force therein. The space charge forces act against the accelerating potential, which is higher in the acceleration region due to the decrease in $V_i$, so that the accelerating potential squeezes down on the beam to cause convergency. Thus, the control of $V_i$ and the plasma density controls the focusing without disturbing the plasma sheath condition for producing a well-formed beam.

This illustration was given with a fixed $V_o$. As a result of fixing $V_o$ and varying $V_i$ around 15%, together with the plasma density, both beam current and the potential across the accelerating region change. If a constant beam current is desired, then $V_i$ and the plasma density could be fixed to maintain the extraction potential at a fixed value. In that case $V_o$ can be adjusted above and below its nominal value to change the potential in the accelerating space to cause beam extraction or expansion.

What is claimed is:

1. A low perveance focusing ion accelerator for producing an ion beam along an axis comprising:
  a screen electrode having a beam opening therein on said axis;
  means for producing ionic plasma upstream from the said beam opening;
  means for extracting and focussing an ion beam from said plasma through said beam opening, said means for extracting and focussing comprising an intermediate electrode and a final electrode, said intermediate electrode and said final electrode each having a beam opening therein on said axis, said beam openings being in alignment on said axis so that an ion beam can be delivered therethrough, said intermediate electrode being positioned between said screen electrode and said final electrode and configured to correspond to the shape of a selected equipotential voltage;
  means connected to said screen electrode, said intermediate electrode and said final electrode for maintaining selected relative potentials therebetween; and
  means for controlling the plasma density, said means for maintaining being connected to maintain substantially consistant the final electrode voltage while the intermediate electrode voltage is changed, and said means for controlling the plasma density changing the plasma density in accordance with intermediate electrode voltage to produce a beam of constant energy, and with beam focus and current varying with changes in intermediate electrode voltage.

2. The focusing ion accelerator of claim 1 wherein said means for controlling the potential on said electrodes includes means for adjusting the potential of said intermediate electrode above and below the potential of the preselected equipotential position on which said intermediate electrode is positioned.

3. A low perveance focussing ion accelerator for producing an ion beam along an axis comprising:
   a screen electrode having a beam opening therein on said axis;
   means for producing ionic plasma upstream from said beam opening;
   means for extracting and focussing an ion beam from said plasma through said beam opening, said means for extracting and focussing comprising an intermediate electrode and a final electrode, said intermediate electrode and said final electrode each having a beam opening therein on said axis, said beam openings being in alignment on said axis so that an ion beam can be delivered therethrough, said intermediate electrode being positioned between said screen electrode and said final electrode and configured to correspond to the shape of a selected equipotential voltage;
   means connected to said screen electrode, said intermediate electrode and said final electrode for maintaining selected relative potentials therebetween and including means for adjusting the potential of said intermediate electrode above and below the potential o the preselected equipotential position on which said intermediate electrode is positioned; and
   means for controlling the plasma density, said means for maintaining hoding the final electrode voltage substantially constant while the intermediate electrode voltage is changed, and the plasma density is changed in accordance with intermediate electrode voltage to produce a beam of constant energy, and with beam focus and current varying with changes in intermediate electrode voltage.

4. A low perveance focussing ion accelerator for producing an ion beam along an axis comprising:
   a screen electrode having a beam opening therein on said axis;
   means for producing ionic plasma upstream from said beam opening and for controlling the density of the ionic plasma;
   means for extracting and focussing an ion beam from said plasma through said beam opening, said means for extracting and focussing comprising an intermediate electrode and a final electrode, said intermediate electrode and said final electrode each having a beam opening therein on said axis, said beam openings being in alignment on said axis so that an ion beam can be delivered therethrough, said intermediate electrode being positioned between said screen electrode and said final electrode and configured to correspond to the shape of a selected equipotential voltage; and
   means connected to said screen electrode, said intermediate electrode and said final electrode for maintaining selected relative potentials therebetween, including means for adjusting the potential of said intermediate electrode above and below the potential of the preselected equipotential position on which said intermediate electrode is positioned so that said plasma density and intermediate electrode voltage are held constant while said means for maintaining potential varies the voltage on said final electrode to provide a beam of varied focus and beam voltage with constant current.

5. The low perveance ion accelerator of claim 1 wherein said plasma sheath at said beam opening is substantially planar and normal to said axis so that an ion beam is produced along said axis of particles moving along said axis in substantially parallel directions.

6. The low perveance ion accelerator of claim 1 wherein said screen electrode and said final electrode are shaped to produce equipotentials at said beam axis substantially normal to said beam axis.

7. A low perveance focusing ion accelerator for producing an ion beam along an axis comprising:
   a screen electrode having a beam opening therein on said axis;
   means for producing ionic plasma upstream from said beam opening;
   means for extracting and focussing an ion beam from said plasma through said beam opening, said means for extracting and focussing comprising an intermediate electrode and a final electrode, said intermediate electrode and said final electrode each having a beam opening therein on said axis, said beam openings being in alignment on said axis so that an ion beam can be delivered therethrough, said intermediate electrode being positioned between said screen electrode and said final electrode and configured to correspond to the shape of a selected equipotential voltage; and
   means connected to said screen electrode, said intermediate electrode and said final electrode to maintain selected relative potentials therebetween, the electrode perveance of said ion accelerator being below about $P_e = 1 \times 10^{-7}$ amps-volts$^{-3/2}$.

8. A low perveance focussing ion accelerator for producing an ion beam along an axis comprising:
   a screen electrode having a beam opening therein on said axis;
   means for producing ionic plasma upstream from said beam opening;
   means for extracting and focussing an ion beam from said plasma through said beam opening, said means for extracting and focussing comprising an intermediate electrode and a final electrode, said intermediate electrode and said final electrode each having a beam opening therein on said axis, said beam openings being in alignment on said axis so that an ion beam can be delivered therethrough, said intermediate electrode being positioned between said screen electrode and said final electrode and configured to correspond to the shape of a selected equipotential voltage;
   means connected to said screen electrode, said intermediate electrode and said final electrode to maintain selected relative potentials therebetween; and
   means for controlling the plasma density, said means for controlling the plasma density holding the plasma density constant and said means connected to said screen electrode and said intermediate electrode holding the voltage therebetween constant while said means connected to said final electrode varies the final electrode voltage to provide a beam of varied focus and beam voltage with constant current.

* * * * *